United States Patent
Gunn

(10) Patent No.: US 8,421,444 B2
(45) Date of Patent: Apr. 16, 2013

(54) COMPACT, TWO STAGE, ZERO FLUX ELECTRONICALLY COMPENSATED CURRENT OR VOLTAGE TRANSDUCER EMPLOYING DUAL MAGNETIC CORES HAVING SUBSTANTIALLY DISSIMILAR MAGNETIC CHARACTERISTICS

(75) Inventor: Colin N. Gunn, Cowichan Bay (CA)

(73) Assignee: Schneider Electric USA, Inc., Palatine, IL (US)

( * ) Notice: Subject to any disclaimer, the term of this patent is extended or adjusted under 35 U.S.C. 154(b) by 553 days.

(21) Appl. No.: 12/650,726

(22) Filed: Dec. 31, 2009

(65) Prior Publication Data

US 2011/0156697 A1 Jun. 30, 2011

(51) Int. Cl.
*G01R 15/18* (2006.01)
*G01R 11/32* (2006.01)

(52) U.S. Cl.
USPC ............................ 324/127; 324/142; 323/357

(58) Field of Classification Search .............. 324/117 H, 324/117 R, 126–127, 142; 323/356–358; 336/145–147, 170
See application file for complete search history.

(56) References Cited

U.S. PATENT DOCUMENTS

| | | | |
|---|---|---|---|
| 3,534,247 A | 10/1970 | Miljanic | |
| 3,881,149 A * | 4/1975 | Kiko | 323/356 |
| 4,841,236 A | 6/1989 | Miljanic et al. | |
| 4,887,028 A | 12/1989 | Voisine et al. | |
| 5,276,394 A * | 1/1994 | Mayfield | 323/356 |
| 5,369,355 A * | 11/1994 | Roe | 323/356 |
| 5,949,231 A * | 9/1999 | Lau | 324/127 |
| 6,674,278 B1 * | 1/2004 | Uesugi | 324/127 |
| 6,943,538 B2 * | 9/2005 | Choi | 324/142 |
| 7,054,167 B2 * | 5/2006 | Yasumura | 363/16 |
| 7,174,261 B2 * | 2/2007 | Gunn et al. | 702/62 |
| 8,242,771 B2 * | 8/2012 | Cheung | 324/126 |
| 8,269,482 B2 * | 9/2012 | Banhegyesi | 324/127 |
| 2007/0126411 A1 * | 6/2007 | Gibellini | 323/356 |

\* cited by examiner

*Primary Examiner* — Joshua Benitez Rosario
(74) *Attorney, Agent, or Firm* — Nixon Peabody LLP

(57) ABSTRACT

A device for sensing electrical current or voltage in an electrical distribution system using an actively compensated current ratio transformer that includes a first magnetic core having a first permeability and a second magnetic core having a second permeability higher than the first permeability. A primary winding having P turns is coupled with the first and second magnetic cores, a measurement winding having M turns is coupled with the first and second magnetic cores so that current in the primary winding induces current in the measurement winding, and a sense winding having S turns is coupled with the second magnetic core. An amplifier coupled to the sense winding receives a voltage developed across the sense winding and produces a compensation current in response to the received voltage. The amplifier has an output coupled to the sense winding to feed the compensation current through the sense winding to reduce the voltage developed across the sense winding voltage to substantially zero. A burden resistor is coupled to the measurement winding and the sense winding for receiving the sum of the current induced in the measurement winding and the compensation current.

16 Claims, 4 Drawing Sheets

COMPACT, TWO STAGE, ZERO FLUX ELECTRONICALLY COMPENSATED CURRENT OR VOLTAGE TRANSDUCER EMPLOYING DUAL MAGNETIC CORES HAVING SUBSTANTIALLY DISSIMILAR MAGNETIC CHARACTERISTICS

FIELD OF THE INVENTION

This invention relates to precision, alternating current and voltage ratio transformation having primary utility in the accurate measurement of higher current or voltage signals applicable to the field of digital power measurement apparatus having fundamental application in 50-60 Hertz AC power systems.

BACKGROUND

Traditional digital power meters typically employ conventional passive internal current transformers and resistive potential dividers in order to reduce relatively large input currents and voltages by a defined and calibrated ratio down to lower currents and voltages that are readily sampled and converted into a digital representation for further signal processing. Current transformers and resistive potential dividers additionally provide much needed electrical isolation between the external current and voltage signals being measured. With potential dividers, the isolation is afforded by providing a robust (transient overload) and high divider impedance (typically >1 Meg ohm) between the voltage source and the digital power meter input circuitry. Current transformation ratios of 1:1000 are common with (but not limited to) typical nominal primary current levels of 1, 5, or 20 Amps in the case of transformer-connected power meters. Voltage transformation ratios of 200:1 are common with (but not limited to) typical nominal voltage inputs ranging from 67 to 600 Vac. Accurate current and voltage transformation, in both magnitude and phase, is required, particularly when AC power calculations are being made at low power factors. Amplitude error of less than +/−100 ppm, combined with phase shift errors of less than +/−1 minute, are required by the newest generation of Class 0.1 digital power meters. Accuracies must be maintained over widely varying signal amplitudes and environmental conditions. Accuracy at higher current and voltage signal frequencies well beyond fundamental 60 Hz power signals are becoming common, particularly when harmonic representation, power quality, and transient analysis is required.

Conventional current ratio transformers suffer from a fundamental electromagnetic limitation that directly impacts their effective use in modern sophisticated digital power meters, particularly the new class of power quality meters requiring high accuracy (Class 0.1), wide dynamic range, stability, and frequency response. This limitation is due to the fact that a portion of the primary input current being measured is required to magnetize the core. This magnetization current component is complex in magnitude and phase and directly impacts the ratio and phase error of the current ratio transformer output current. Core magetization effects may also impact accuracy by shifting the transformer flux swing operating point. Larger, high permeability cores are typically used in order to minimize the effects of core magnetization loss. These undesirable effects are only reduced and not eliminated through the use of such cores. Tape wound torroidal cores, made of ultra high permeability magnetic alloys, such as Molypermalloy, Supermalloy, and Amorphous Glass, may be required to meet the 60 Hz accuracy specifications, but issues of cost, size, and accuracy often limit their inclusion in new high performance designs.

A conventional potential divider used for power meter AC input voltage division typically utilizes high valued resistors in order to safely divide the input signal to low levels compatible with conventional electronic analog to digital conversion circuitry. The divider input resistor values must also be of high value in order to limit power dissipation under nominal and overload conditions while reducing leakage currents to safe levels. Unfortunately, the use of such high value resistor divider chains can result in temperature, humidity, capacitive, and thermal noise induced stability issues. The use of high precision matched resistive dividers (e.g., metal foil) are generally required for high accuracy applications but come at a high cost factor.

The continuing trend of increased digital power meter performance, particularly in areas of accuracy and frequency response, requires a new and improved approach.

BRIEF SUMMARY

The present disclosure provides a device for sensing electrical current or voltage in an electrical distribution system using an actively compensated current ratio transformer that includes a first magnetic core having a first permeability and a second magnetic core having a second permeability higher than the first permeability. A primary winding having P turns is coupled with the first and second magnetic cores and is connected to a source of current to be measured. A measurement winding having M turns is coupled with the first and second magnetic cores so that the current to be measured in the primary winding induces current in the measurement winding, and a sense winding having S turns is coupled with the second magnetic core. An amplifier coupled to the sense winding receives a voltage developed across the sense winding and produces a compensation current in response to the received voltage. The amplifier has an output coupled to the sense winding to feed the compensation current through the sense winding to reduce the voltage developed across the sense winding voltage to substantially zero. A burden resistor is coupled to the measurement winding and the sense winding for receiving the sum of the current induced in the measurement winding and the compensation current. The summing of the compensation current with the current induced in the measurement winding preferably compensates for magnetization losses in the first magnetic core, so that the voltage produced across the burden resistor is substantially proportional to the current to be measured in the primary winding multiplied by the ratio P/M.

In one embodiment, the measurement winding has a greater number of turns than the sense winding, and an attenuation circuit attenuates the compensation current, before the summing of the compensation current with the current induced in the measurement winding, to compensate for the difference between the number of turns in the sense winding and the number of turns in the measurement winding.

In one implementation, the permeability of the second magnetic core is at least three times the permeability of the first magnetic core and is substantially independent of temperature.

BRIEF DESCRIPTION OF THE DRAWINGS

The invention may best be understood by reference to the following description taken in conjunction with the accompanying drawings, in which.

DETAILED DESCRIPTION

Although the invention will be described in connection with certain preferred embodiments, it will be understood that the invention is not limited to those particular embodiments. On the contrary, the invention is intended to cover all alternatives, modifications, and equivalent arrangements as may be included within the spirit and scope of the invention as defined by the appended claims.

Figure 1:
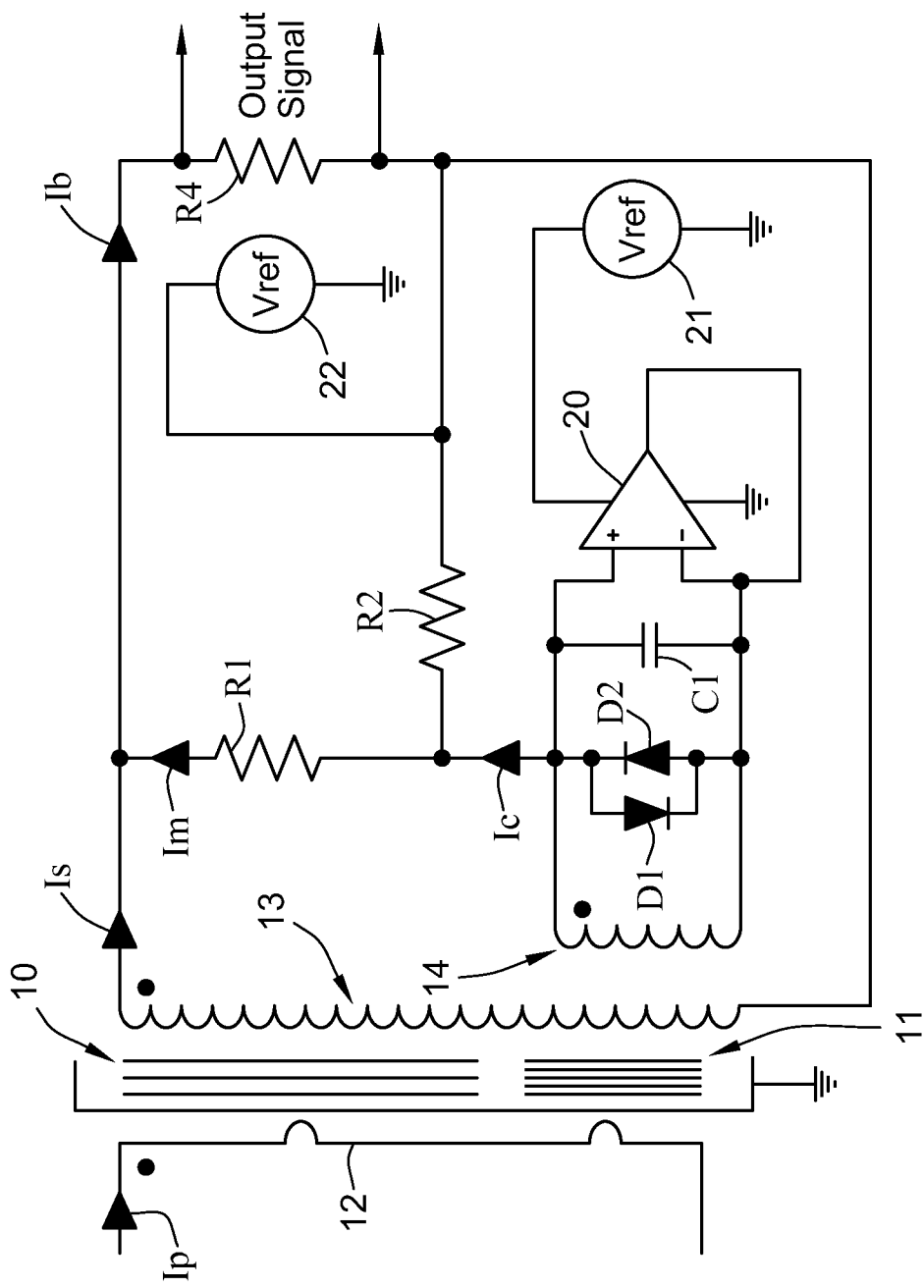
FIG. 1 is an electrical schematic diagram of a current transformer embodying the invention.
Figure 3:
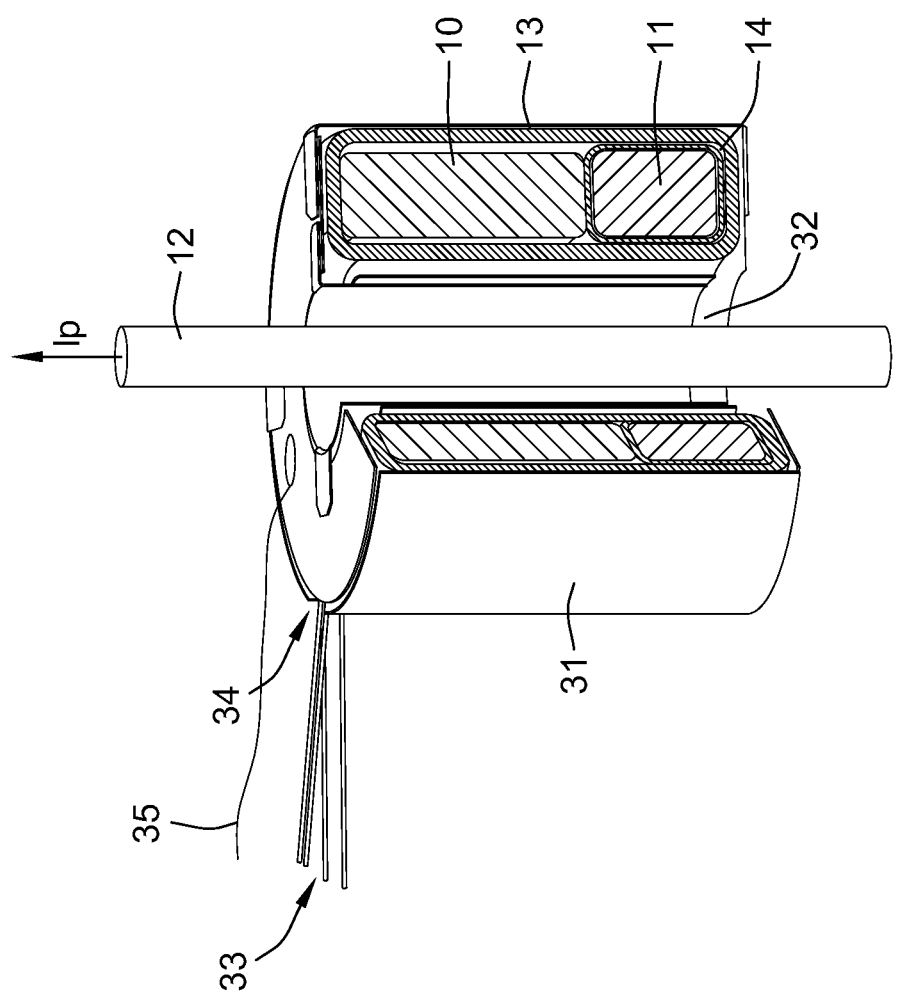
FIG. 3 is a sectioned perspective view of an actively compensated current or voltage ratio transformer.

FIG. 1 shows an actively compensated current ratio transformer device having a lower permeability first "main" core 10, and a higher permeability second "sense" core 11 physically positioned in a stacked arrangement as shown in FIG. 3. The main core is made of a lower cost and lower permeability material (such as a ferrite, e.g., Ferroxcube 3E6 Ferrite), while the sense core 11 is made of a higher permeability metal amorphous core material (such as a base metal composition, e.g., Vacuuschmelze Vitroperm). This combination maximizes accuracy and stability while maintaining a low overall component cost.

Referring to FIG. 1, a primary winding 12, having P turns, couples magnetically with both the lower permeability main core 10 and the higher permeability sense core 11. For current transformer use, the primary winding 12 is nominally, but not limited to, a single-turn conductor. The measurement current of interest is the primary winding current Ip flowing in the primary winding 12.

A measurement winding 13, having M turns, also couples magnetically with both the lower permeability first main core 10 and the second higher permeability sense core 6. The turns ratio of the measurement winding 13 to the primary winding 12 is nominally of high value in order to reduce the primary winding current Ip to an acceptable (galvanically isolated) lower level for measurement as a voltage developed across burden resistor R4 as the result of a burden current Ib flowing through the burden resistor R4. Typical values of the primary winding current Ip, for current transformer use, range from 0 to 5 A RMS 50/60 Hz in transformer-connected power metering applications.

A sense winding 14, having S turns, couples electromagnetically with only the second higher permeability sense core 11.

In summary, the first lower permeability main core 10 is electromagnetically coupled to two windings: the primary winding 12 and the measurement winding 13. The second higher permeability sense core 11 is electromagnetically coupled to three windings: the primary winding 12, the measurement winding 13, and the sense winding 14.

Figure 2:
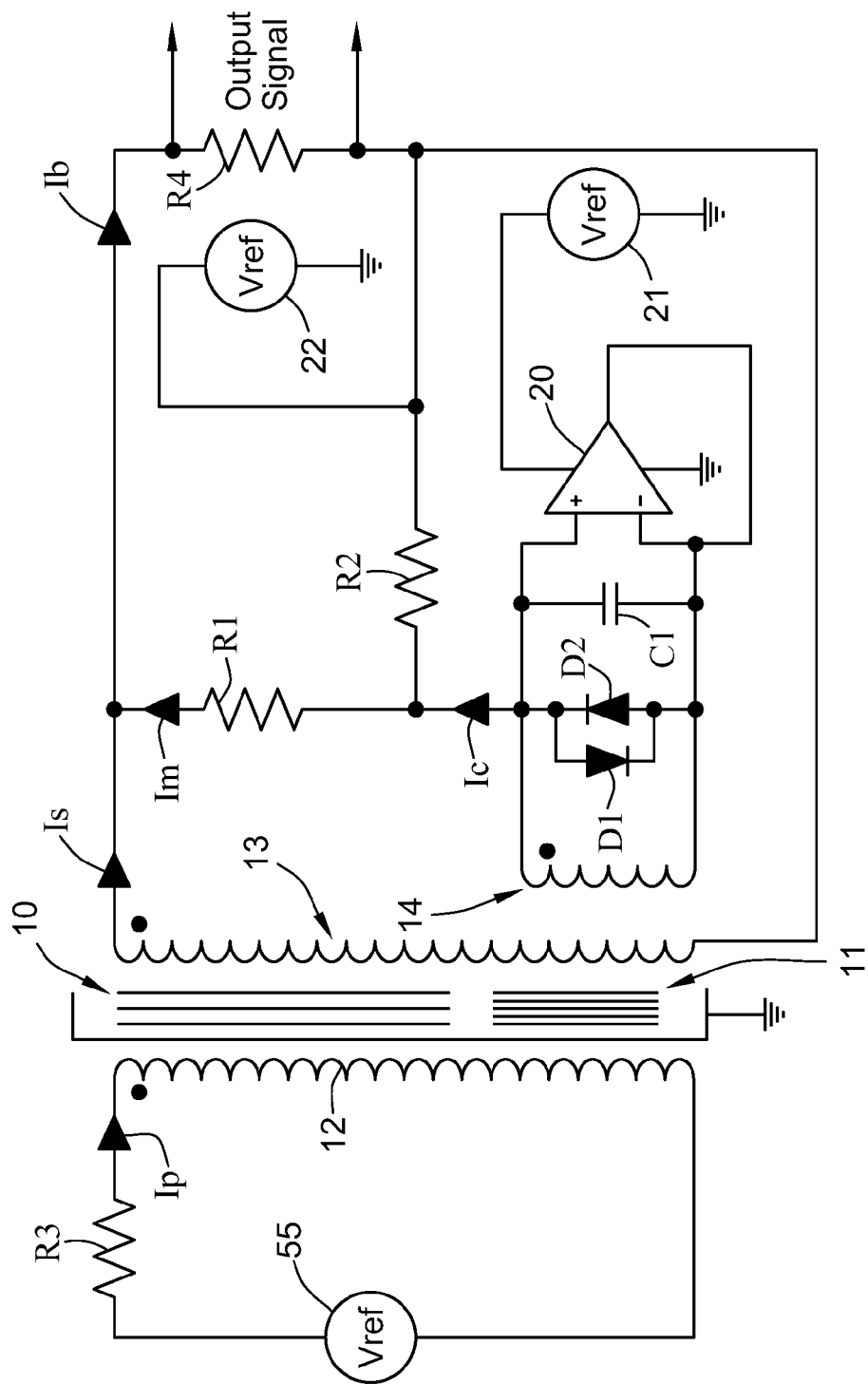
FIG. 2 is an electrical schematic diagram of a voltage transformer embodying the invention.

FIG. 2 shows an actively compensated voltage ratio device having physical and electrical topology that is substantially the same as that of the current ratio transformer of FIG. 1, with the addition of a series voltage dropping resistor R3. An increase in the number (P=1000) of primary winding turns is combined with an increase in the impedance of the burden resistor R4 (e.g., in 100 ohms). An external AC voltage source Vs is applied to the primary winding 2. The number of turns for all the windings, and the values of all the components, may be selected for specific uses (to accommodate specific input/output voltage and current levels).

The output of the sense winding 14 is connected to the high impedance inverting and non-inverting inputs of a high gain voltage operational amplifier 20, the voltage output of which drives a compensation current Ic through the sense winding 14. The sense winding compensation current Ic is reduced in level through a divider formed by resistors R1 and R2, and applied as a measurement winding current Im to the measurement winding circuit. A pair of parallel diodes D1 and D2 connected across the inputs of the amplifier 20 protect the input of the operational amplifier 20 from possible transient primary winding over-range signal conditions. A capacitor C1 connected across the inputs of the amplifier 20 provides compensation circuit stability.

The operational amplifier 20 is provided with power from a +5 Vdc voltage supply 21 (e.g., +5 Vdc). A virtual ground reference DC voltage supply 22 (e.g., +2.5 Vdc) provides a reference source effectively biasing the static DC operating point of the output of the operational amplifier 20 to a voltage level that centers the output swing within the range of the primary supply 21. It will be appreciated that other supply and reference source supply configurations are possible without affecting the underlying circuit operation. The example shown here is based on having a single unipolar operational amplifier supply 21. Dual supply and ground referenced offset voltage sources can easily be accommodated depending on the specific supply voltage level availability.

For current transformer operation, the AC current being measured (FIG. 1) is applied to the input of the primary winding 12 having P turns and flows as the primary winding current Ip.

Through transformer action, a secondary current Is develops in the measurement winding 5 having M turns and is represented by the following equation:

$$\overline{Is} = \frac{Ip}{\frac{M}{P}} - \overline{Im}$$

The measurement winding current Im represents the current required to magnetize the lower permeability main core 10 and arises due to transformer and main core losses. The current Im is a complex vector quantity of varying magnitude and phase, having non-linear sensitivity to the characteristics of the core material, operating temperature, and core flux level. Without active compensation, the resulting secondary current and the voltage across the burden resistor R4 have unacceptable ratio and phase errors, as referenced to the primary current Ip. These errors are unacceptable for high accuracy power metering applications.

It will be noted that the standard dot convention is used in FIGS. 1 and 2 to indicate the direction of each winding relative to the other windings in the transformer. Voltages at the dot end of each winding are in phase, while current flowing into the dot end of a primary coil will result in current flowing out of the dot end of a secondary coil.

The operational amplifier 20 is arranged with its inverting and non-inverting inputs connected directly across the sense winding 14 output which is electromagnetically linked to only the higher permeability sense core 11. The operational amplifier 20 operates to effectively reduce to zero any voltage appearing across the sense winding 14 through a feedback connection made between the output and the inverting input of the amplifier 20, and connected to one end of the sense winding 14. The sense winding 14 compensation current Ic develops to force the sense winding voltage output to zero. By Faraday's law of induction, having zero output voltage from the sense winding 14 implies a zero time-varying flux condition in the high permeability sense core 11. The high permeability sense core 11 is therefore operating, through active compensation, at close to zero flux, and thus experiences very low core losses. Non-ideal operational amplifier characteristics (finite gain, noise, offsets), winding copper losses, and flux leakage paths prevent complete reduction of sense core 11 operating flux. The use of a high permeability (and stable) material for the sense core 11 keeps residual losses (and errors) at very low levels. The very low flux density in the sense core 11 allows for a small sense core magnetic cross section, thereby maintaining low overall costs when using more expensive higher permeability materials.

The sense winding compensation current Ic effectively removes the primary winding-to-measurement winding ampere-turn imbalance since both these windings also link the higher permeability core 11. The ampere-turn imbalance is due to the measurement winding current Im required to magnetize the lower permeability core. Im is numerically equal to:

$$\vec{Im} = \frac{\vec{Ic}}{\frac{M}{S}}$$

S is the number of sense winding turns and M is the number of measurement winding turns. It is advantageous to have a reduced number of sense winding 14 turns in order to reduce both manufacturing costs and winding resistance, especially when higher primary to secondary ratios exist, i.e. when M measurement winding turns are high. The effect of the compensation current Ic through the resistive voltage drop across the sense winding 14 is minimized by using a lower number of sense winding turns. It should be noted that the finite gain and drive capability of the operational amplifier 20 establishes a lower limit to the number S of sense winding turns.

The compensation current Ic is reduced by a current divider formed by resistors R1 and R2 before injection into the measurement winding circuit as Im. The following equality applies:

$$\frac{S}{M} = \frac{R2}{R1+R2}$$

Active compensation is completed through the injection of electronically derived current Im into the measurement winding circuit, effectively replacing the magnetization current component lost in magnetizing the lower permeability main core 10. Under conditions of active compensation, the ampere-turns of the primary winding 14 is in precise balance with the ampere-turns of the secondary measurement winding 13 and therefore the resulting burden current Ib is related to the primary current Ip by a constant factor of M/P (measurement winding to primary winding turns ratio). Ratio and phase errors are therefore essentially removed from the burden current Ib and the resultant output voltage developed across the burden resistor R4. It will be appreciated that the correct current or voltage transformer winding polarity relationship is mandatory for proper active compensation to occur.

For potential transformer operation (FIG. 2), the primary winding current Ip equals the input voltage Vs divided by the sum of an input resistor R3 and the reflected burden impedance R4/(M/P)$^2$. With P=M, the turns ratio is unity and therefore the reflected impedance (varies as the square of the turns ratio) is simply equal to the value of R4. The following equation shows the relationship of Ip to input voltage Vs:

$$Ip = \frac{Vs}{R3 + \frac{R4}{\left(\frac{M}{P}\right)^2}}$$

FIG. 3 shows the physical construction of the actively compensated current or voltage ratio transformer having a stacked toroidal arrangement of the cores 10 and 11 to help minimize leakage flux and improve the self-shielding characteristics of the compensated current or voltage ratio transformer combined with a measurement winding 13 and a sense winding 14. (Other arrangements are possible, including a toroid-within-a-toroid arrangement but are generally more expensive and complex than needed for a power metering application.) The measurement winding 13 is wound over both cores 10 and 11, while the sense winding 14 is wound only over the sense core 11. The primary winding 12 is shown as a single turn in the current transformer embodiment and passes through the central tunnel 30 of the stacked toroidal core combination.

The voltage transformer embodiment typically requires many primary turns (not shown in FIG. 3) which are wound over an insulating layer positioned directly on top of an electrostatic and magnetic stamped metal shield 31 that completely covers the current ratio transformer including the internal surface of the axial tunnel 30. A small air gap 32 prevents the shield from forming a shorted secondary turn. The shield 31 operates to prevent stray electrostatic and higher frequency magnetic fields from coupling to the windings and/or the main and sense cores. The measurement winding 13 and the sense winding 14 are brought out as two conductor pairs 33 through a small opening 34 in the outer shield 31. A shield ground connection wire 35 is provided with one end physically soldered to the shield 31. The illustrative embodiment employs a significant number of machine wound turns requiring the use of fine copper wire (e.g., 34 AWG) in order to construct a commercially viable compact and cost effective transducer.

Figure 4:
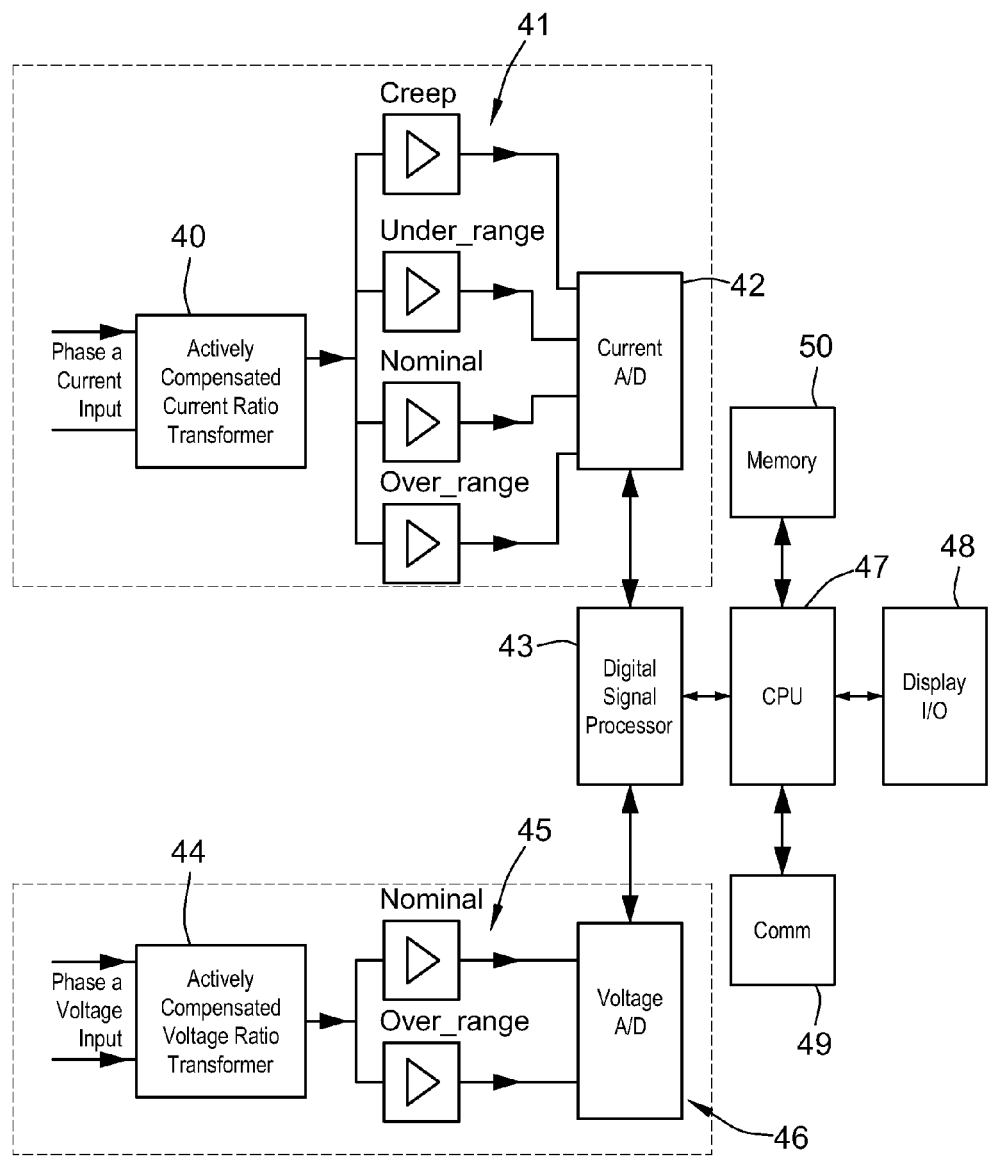
FIG. 4 is a block diagram of a digital power meter including the current and voltage transformers of FIGS. 1 and 2.

FIG. 4 illustrates a typical application of the actively compensated current and voltage ratio transformers as employed in a digital power meter. For schematic simplicity, the block diagram of FIG. 4 illustrates the key functional sections with a single phase voltage and current pair (phase A) shown. It will be appreciated that for polyphase applications, a simple duplication of the analog circuitry is all that is required (from a hardware standpoint) for additional voltage and current phase pairs.

The primary input current Ip is applied to an actively compensated current ratio transformer 40 as previously described and shown in FIG. 1. The compensated burden resistor voltage output is applied to a series of fixed gain amplifiers 41 ranging from a high gain CREEP stage to a lower gain OVER_RANGE stage. The outputs of these amplifiers 41 are applied to the multiplexed inputs of a current A/D converter 42. The specific selected input is controlled by a digital signal processor 43 operating to select the required range based on current signal levels. This auto-ranging capability utilizes the wide dynamic range offered by the actively compensated current ratio transformer topology.

The corresponding voltage phase is applied to an actively compensated voltage ratio transformer 44 as previously described and shown in FIG. 2. The output drive dual-range-gain amplifiers 45 in a similar fashion to the corresponding current channel. The outputs of the amplifiers 45 are applied to the multiplexed inputs of a voltage A/D converter 46. Both the current and voltage A/D converters 42 and 46 are simultaneously sampled with the acquired digital waveform representation processed in real time by the digital signal processor 43 and a main CPU 47. Power measurement quantities, such as real power (watts), reactive power (VARS), energy (watt-hrs), volts (RMS), current (RMS) and power factor, are provided to the user through a display I/O 48 and a digital COMM 49. A large memory bank 50 is used for storage of variables, waveforms and programs.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

The invention claimed is:

1. A device for sensing electrical current in an electrical distribution system, said device comprising:
   a first magnetic core having a first permeability and a second magnetic core having a second permeability higher than said first permeability,
   a primary winding comprising P turns coupled with said first and second magnetic cores and connected to a source of current to be measured,
   a measurement winding comprising M turns coupled with said first and second magnetic cores so that said current to be measured in said primary winding induces current in said measurement winding,
   a sense winding comprising S turns coupled with said second magnetic core, said measurement winding having a greater number of turns than said sense winding,
   an amplifier coupled to said sense winding for receiving a voltage developed across said sense winding and producing a compensation current in response to said received voltage, said amplifier having an output coupled to said sense winding to feed said compensation current through said sense winding to reduce said voltage developed across said sense winding voltage to substantially zero,
   a burden resistor coupled to said measurement winding and said sense winding for receiving the sum of said current induced in said measurement winding and said compensation current, and
   an attenuation circuit receiving said compensation current and attenuating said compensation current, before the summing of said compensation current with said current induced in said measurement winding, to compensate for the difference between the number of turns in said sense winding and the number of turns in said measurement winding.

2. The device of claim 1 in which S is substantially smaller than M.

3. The device of claim 1 in which said current induced in said measurement winding magnetization current is substantially equal to said compensation current multiplied by S/M.

4. The device of claim 1 in which said amplifier comprises an operational amplifier having non-inverting and inverting inputs coupled to opposite ends of said sense winding, and an output, said inverting input and said output being coupled to the non-dotted end of said sense winding, and
   in which said attenuation circuit comprises a first resistor connected between said non-inverting input and the dotted end of said measurement winding, and a second resistor connected between said non-inverting input and a reference point.

5. The device of claim 4 in which said first resistor has a value R1 and said second resistor has a value R2, and the ratio S/M is substantially equal to the ratio of R1/(R1+R2).

6. The device of claim 1 which includes a diode clamp across said sense winding.

7. The device of claim 1 in which M is substantially equal to 1000 and S is substantially equal to 258.

8. The device of claim 1 in which said first magnetic core comprise ferrite material, and said second magnetic core comprises a base metal composition.

9. The device of claim 1 which includes an electrostatic and magnetic metal shield surrounding said actively compensated current ratio transformer.

10. The device of claim 9 which includes a ground connection wire bonded to said electrostatic and magnetic metal shield.

11. The device of claim 1 in which the summing of said compensation current with said current induced in said measurement winding compensates for magnetization losses in said first magnetic core, so that the voltage produced across said burden resistor is substantially proportional to said current to be measured in said primary winding multiplied by the ratio P/M.

12. The device of claim 11 in which the ratio P/M is a substantially in-phase and real-valued proportionality constant.

13. The device of claim 1 in which the permeability of said second magnetic core is substantially independent of temperature.

14. A digital power meter comprising
   a current ratio transformer having:
      a first magnetic core having a first permeability and a second magnetic core having a second permeability higher than said first permeability,
      a primary winding comprising P turns coupled with said first and second magnetic cores and connected to a source of current to be measured,
      a measurement winding comprising M turns coupled with said first and second magnetic cores so that said current to be measured in said primary winding induces current in said measurement winding,
      a sense winding comprising S turns coupled with said second magnetic core, said measurement winding having a greater number of turns than said sense winding,
      an amplifier coupled to said sense winding for receiving a voltage developed across said sense winding and producing a compensation current in response to said received voltage, said amplifier having an output coupled to said sense winding to feed said compensation current through said sense winding to reduce said voltage developed across said sense winding voltage to substantially zero,
      a burden resistor coupled to said measurement winding and said sense winding for receiving the sum of said current induced in said measurement winding and said compensation current, and
      an attenuation circuit receiving said compensation current and attenuating said compensation current, before the summing of said compensation current with said current induced in said measurement winding, to compensate for the difference between the number of turns in said sense winding and the number of turns in said measurement winding, a plurality of fixed gain amplifiers coupled to said burden resistor for producing corresponding outputs having different gains, an analog-to-digital converter receiving the outputs of said amplifiers and converting said outputs to corresponding digital signals, a digital signal processor coupled to said analog-to-digital converter for sampling said digital signals based on the current signal levels, a CPU receiving the sampled signals from said digital signal processor, and a memory and a display coupled to said CPU.

15. The digital power meter of claim 14 that includes a communication link coupled to said CPU.

16. The digital power meter of claim 14 that includes a voltage transformer coupled to said digital signal processor.

* * * * *